United States Patent
Yang et al.

(10) Patent No.: US 11,164,878 B2
(45) Date of Patent: Nov. 2, 2021

(54) INTERCONNECT AND MEMORY STRUCTURES HAVING REDUCED TOPOGRAPHY VARIATION FORMED IN THE BEOL

(71) Applicant: International Business Machines Corporation, Armonk, NY (US)

(72) Inventors: Chih-Chao Yang, Glenmont, NY (US); Baozhen Li, South Burlington, VT (US); Raghuveer Reddy Patlolla, Guilderland, NY (US); Cornelius Brown Peethala, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 16/777,540

(22) Filed: Jan. 30, 2020

(65) Prior Publication Data
US 2021/0242216 A1 Aug. 5, 2021

(51) Int. Cl.
| H01L 27/088 | (2006.01) |
| H01L 27/24 | (2006.01) |
| H01L 27/22 | (2006.01) |
| H01L 27/108 | (2006.01) |

(52) U.S. Cl.
CPC ...... *H01L 27/10897* (2013.01); *H01L 27/088* (2013.01); *H01L 27/222* (2013.01); *H01L 27/2481* (2013.01)

(58) Field of Classification Search
CPC ............. H01L 27/10897; H01L 27/222; H01L 27/088; H01L 27/2481
See application file for complete search history.

(56) References Cited

U.S. PATENT DOCUMENTS

| 5,850,105 A | 12/1998 | Dawson et al. |
| 6,197,397 B1 | 3/2001 | Sher et al. |
| 7,939,422 B2 | 5/2011 | Ingle et al. |
| 8,927,390 B2 | 1/2015 | Sapre et al. |
| 8,952,547 B2 | 2/2015 | Liaw |
| 9,281,211 B2 | 3/2016 | Yang et al. |
| 10,056,488 B2 | 8/2018 | Pradhan et al. |
| 2002/0173079 A1 | 11/2002 | Kaltalioglu |
| 2005/0136684 A1 | 6/2005 | Mukai et al. |
| 2006/0128144 A1 | 6/2006 | Park et al. |
| 2020/0403144 A1* | 12/2020 | Lai .......................... H01L 43/08 |

FOREIGN PATENT DOCUMENTS

CA 2274750 C 1/2013

* cited by examiner

*Primary Examiner* — Steven H Loke
*Assistant Examiner* — Juanita B Rhodes
(74) *Attorney, Agent, or Firm* — Scully, Scott, Murphy & Presser, P.C.; L. Jeffrey Kelly, Esq.

(57) ABSTRACT

Interconnect structures or memory structures are provided in the BEOL in which topography variation is reduced. Reduced topography variation is achieved by providing a structure that includes a first dielectric capping layer that has a planar topmost surface and/or a second dielectric capping layer that has a planar topmost surface. The first dielectric capping layer has a non-planar bottom surface that contacts both a recessed surface of an interconnect dielectric material layer and a planar topmost surface of at least one electrically conductive structure that is embedded in the interconnect dielectric material layer.

20 Claims, 5 Drawing Sheets

INTERCONNECT AND MEMORY STRUCTURES HAVING REDUCED TOPOGRAPHY VARIATION FORMED IN THE BEOL

BACKGROUND

The present application relates to back-end-of-the-line (BEOL) technology, and more particularly to an interconnect structure or a memory structure that is formed in the BEOL.

Topography variation is one concern in the manufacturing of advanced interconnect structures and memory structures. Topography variation can include wafer center vs. wafer edge (global variation), die to die (global variation), macro to macro (local/global variation), and within macro (local variation). Topography variation within an interconnect structure or memory structure can cause deleterious problems such as, for example, amplifying variation on the amount of material removal from a later patterning process. There is thus a need to provide interconnect structures or memory structures in the BEOL in which topography variation is reduced.

SUMMARY

In one aspect of the present application, advanced interconnect structures or memory structures are provided in the BEOL in which topography variation is reduced; in the present application reduced topography variation encompasses complete elimination of topography variation. Reduced topography variation is achieved by providing a structure that includes a first dielectric capping layer that has a planar topmost surface and/or a second dielectric capping layer that has a planar topmost surface. The first dielectric capping layer has a non-planar bottom surface that contacts both a recessed surface of an interconnect dielectric material layer and a planar topmost surface of at least one electrically conductive structure that is embedded in the interconnect dielectric material layer.

In one embodiment of the present application, the structure (interconnect or memory) includes at least one electrically conductive structure partially embedded in an interconnect dielectric material layer, wherein the interconnect dielectric material layer has a recessed surface located laterally adjacent to the at least one electrically conductive structure. A first dielectric capping layer is located on the interconnect dielectric material layer and the at least one electrically conductive structure, wherein the first dielectric capping layer has a non-planar bottom surface that contacts both the recessed surface of the interconnect dielectric material layer and a planar topmost surface of the at least one electrically conductive structure. A second dielectric capping layer is located on the first dielectric capping layer, wherein the second dielectric capping layer has an entirely planar topmost surface. At least one metal-containing structure is located in the first dielectric capping layer and the second dielectric capping layer, wherein the at least one metal-containing structure contacts the at least one electrically conductive structure.

In another embodiment of the present application, the structure (interconnect or memory) includes at least one electrically conductive structure partially embedded in an interconnect dielectric material layer, wherein the interconnect dielectric material layer has a recessed surface located laterally adjacent to the at least one electrically conductive structure. A first dielectric capping layer is located on the recessed surface of the interconnect dielectric material and the at least one electrically conductive structure, wherein the first dielectric capping layer has an entirely planar topmost surface and a non-planar bottom surface that contacts both the recessed surface of the interconnect dielectric material layer and a planar topmost surface of the at least one electrically conductive structure. A least one metal-containing structure is located in the first dielectric capping layer, wherein the at least one metal-containing structure contacts the at least one electrically conductive structure.

In another aspect of the present application, methods are provided to form interconnect structures or memory structures in the BEOL which have reduced topography variation. In one embodiment, the method includes forming at least one electrically conductive structure partially embedded in an interconnect dielectric material layer, wherein the interconnect dielectric material layer has a recessed surface located laterally adjacent to the at least one electrically conductive structure. Next, a first dielectric capping layer is formed on the interconnect dielectric material layer and the at least one electrically conductive structure, wherein the first dielectric capping layer has a non-planar bottom surface that contacts both the recessed surface of the interconnect dielectric material layer and a planar topmost surface of the at least one electrically conductive structure. A second dielectric capping layer is then formed on the first dielectric capping layer, wherein the second dielectric capping layer has an entirely planar topmost surface. Next, at least one metal-containing structure is formed in the first dielectric capping layer and the second dielectric capping layer, wherein the at least one metal-containing structure contacts the at least one electrically conductive structure.

In another embodiment, the method includes forming at least one electrically conductive structure partially embedded in an interconnect dielectric material layer, wherein the interconnect dielectric material layer has a recessed surface located laterally adjacent to the at least one electrically conductive structure. A first dielectric capping layer is formed on the interconnect dielectric material layer and the at least one electrically conductive structure, wherein the first dielectric capping layer has an entirely planar topmost surface and a non-planar bottom surface that contacts both the recessed surface of the interconnect dielectric material layer and a planar topmost surface of the at least one electrically conductive structure. At least one metal-containing structure is thereafter formed in the first dielectric capping layer, wherein the at least one metal-containing structure contacts the at least one electrically conductive structure.

DETAILED DESCRIPTION

Figure 1:
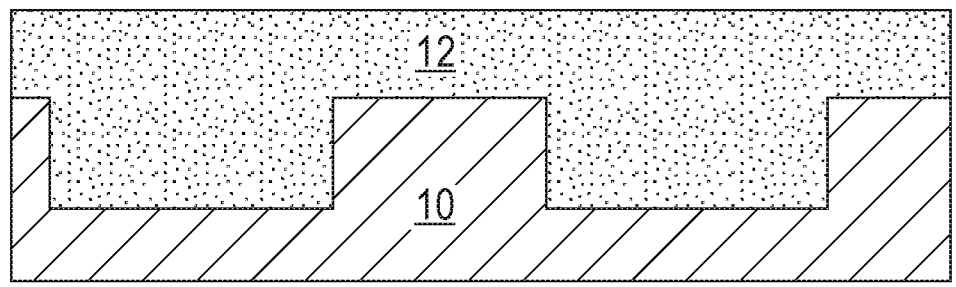
FIG. 1 is a cross sectional view of an exemplary structure that can be employed in accordance with an embodiment of the present application, wherein the exemplary structure includes an electrically conductive metal-containing layer located on a topmost surface of an interconnect dielectric material layer and filling at least one opening that is present in the interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in accordance with an embodiment of the present application. As is shown, the exemplary structure of FIG. 1 includes an electrically conductive metal-containing layer 12 located on a topmost surface of an interconnect dielectric material layer 10 and filling at least one opening (two are shown in FIG. 1 by way of one example) that is present in the interconnect dielectric material layer 10.

It is noted that the interconnect dielectric material layer 10 can be formed on a metal level (not shown) that is located above a front-end-of-the-line (FEOL) level (also not shown) that contains one or more semiconductor devices such as, for example, a transistor formed therein. In some embodiments, the metal level is a middle-of-the-line (MOL) level. In other embodiments, the metal level is a lower interconnect level that is positioned beneath the interconnect dielectric material layer 10. In either embodiment, the metal level includes a dielectric material layer that contains at least one metal level electrically conductive structure embedded therein that is connected, either directly or indirectly, to an underlying CMOS device (not shown) that is present in the FEOL level.

The interconnect dielectric material layer 10 can be composed of an inorganic dielectric material and/or an organic dielectric material. In some embodiments, the interconnect dielectric material layer 10 can be porous. In other embodiments, the interconnect dielectric material layer 10 can be non-porous. Examples of suitable dielectric materials that can be employed as the interconnect dielectric material layer 10 include, but are not limited to, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The interconnect dielectric material layer 10 can have a dielectric constant that is about 4.0 or less. All dielectric constants mentioned herein are measured relative to a vacuum unless otherwise noted. In one embodiment, the interconnect dielectric material layer 10 has a dielectric constant of 2.8 or less. These dielectrics generally having a lower parasitic cross talk as compared to dielectric materials whose dielectric constant is greater than 4.0.

The interconnect dielectric material layer 10 can be formed by a deposition process such as, for example, chemical vapor deposition (CVD), plasma enhanced chemical vapor deposition (PECVD) or spin-on coating. The interconnect dielectric material layer 10 can have a thickness from 50 nm to 250 nm. Other thicknesses that are lesser than 50 nm, and greater than 250 nm can also be employed as the thickness of the interconnect dielectric material layer 10 in the present application. The as deposited interconnect dielectric material 10 has a planar topmost surface.

After providing the interconnect dielectric material layer 10, at least one opening (not specifically shown) is formed into the interconnect dielectric material layer 10; each opening will house an electrically conductive structure 12S and, if present, a diffusion barrier liner. The at least one opening that is present in the interconnect dielectric material layer 10 can be a via opening, a line opening or a combined via/line opening. The at least one opening can be formed by lithography and etching. Lithography includes forming a photoresist material (not shown) on a material or material stack that needs to be patterned. The photoresist material is then exposed to a pattern of irradiation, and thereafter the exposed photoresist material is developed utilizing a conventional resist developer. Etching can include a dry etching process and/or a wet etching process.

In some embodiments, a diffusion barrier material can be formed on the topmost surface of the interconnect dielectric material layer 10 and within the at least one opening prior to forming the electrically conductive metal-containing layer 12; the diffusion barrier material will provide the diffusion barrier liner mentioned above. The diffusion barrier material can include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material can have a thickness from 2 nm to 50 nm; although other thicknesses for the diffusion barrier material are contemplated and can be employed in the present application as long as the diffusion barrier material does not entirety fill the opening that is formed into the interconnect dielectric material layer 10. The diffusion barrier material can be formed by a deposition process including, for example, CVD, PECVD, atomic layer deposition (ALD), physical vapor deposition (PVD), sputtering, chemical solution deposition or plating.

The electrically conductive metal-containing layer 12 is formed into each opening and, if present, atop the diffusion barrier material. The electrically conductive metal-containing layer 12 is composed of an electrically conductive material. In one embodiment, the electrically conductive metal-containing layer 12 can be composed of an electrically conductive metal, an electrically conductive metal alloy or an electrically conductive metal nitride. In such an embodiment, the electrically conductive metal-containing layer 12 can be composed of Ta, Ti, W, Co, Ru, Jr or Rh, or their nitrides or alloys. Other examples of electrically conductive materials for the electrically conductive metal-containing layer 12 include Cu, Al or a Cu—Al alloy.

The electrically conductive metal-containing layer 12 can be formed utilizing a deposition process such as, for example, CVD, PECVD, sputtering, chemical solution deposition or plating. In one embodiment, a bottom-up plating process is employed in forming the electrically conductive metal or metal alloy. The electrically conductive metal-containing layer 12 is formed on the topmost surface of the interconnect dielectric material layer 10 as shown in FIG. 1 and within each opening that is present in the interconnect dielectric material; the portion of the electrically conductive metal-containing layer 12 that is located outside the at least one opening that is present in the interconnect dielectric material layer 10 can be referred to herein as an overburden portion of the electrically conductive metal-containing layer.

Figure 2:
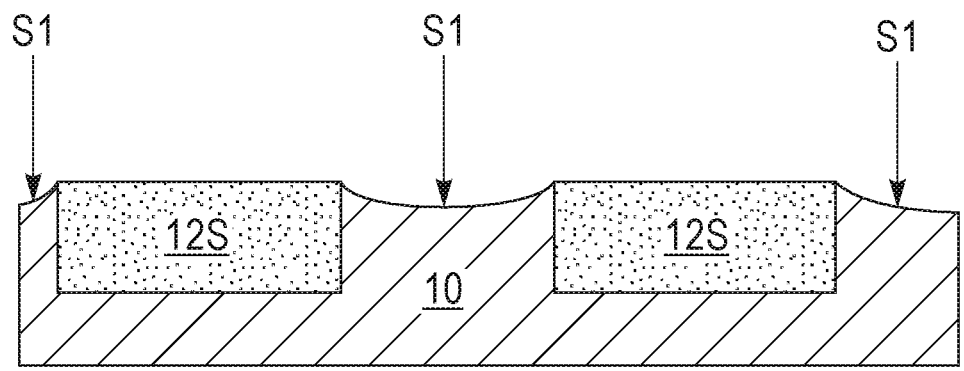
FIG. 2 is a cross sectional view of the exemplary structure of FIG. 1 after chemical mechanical polishing (CMP) of the electrically conductive metal-containing layer to provide at least one electrically conductive structure partially embedded in the interconnect dielectric material layer, wherein the CMP also recesses the interconnect dielectric material layer and thus provides a recessed surface to the interconnect dielectric material layer.

Referring now to FIG. 2, there is illustrated the exemplary structure of FIG. 1 after chemical mechanical polishing (CMP) of the electrically conductive metal-containing layer 12 to provide at least one electrically conductive structure 12S partially embedded in the interconnect dielectric material layer 10, wherein the CMP also recesses (i.e., dishes out) the interconnect dielectric material layer 10 and thus provides a recessed surface, S1, to the interconnect dielectric material layer 10. Each electrically conductive structure 12S has a topmost surface that is planar after the CMP process.

The recessing of the interconnect dielectric material layer 10 occurs laterally adjacent to each electrically conductive structure 12S that is formed during the CMP process. In some embodiments of the present application (and as shown in FIG. 2), the recessed surface, S1, that is provided to the interconnect dielectric material layer 10 during the CMP process is concave. By 'concave' is meant that a material structure has a surface that curves inward to provide a material structure that is thinner in the middle than on the edges.

Each electrically conductive structure 12S is present in one of the openings that is formed into the interconnect dielectric material layer 10. Each electrically conductive structure 12S has a topmost surface that is located above the recessed surface, S1, of the interconnect dielectric material layer 10.

In some embodiments, and when a diffusion barrier material is present, the CMP process also removes the diffusion barrier material from the topmost surface of the interconnect dielectric material layer 10. The remaining portion of the diffusion barrier material that remains in the opening after this CMP process is referred to herein as the diffusion barrier liner, while the remaining portion of the electrically conductive metal-containing layer 12 that is present after this CMP process is referred to as the electrically conductive structure 12S. Collectively, the interconnect dielectric material layer 10, each optional diffusion barrier liner, and each electrically conductive structure 12S can define an interconnect level, $L_n$. In the term "$L_n$," n can be 1, 2, 3, etc.

Figure 3:
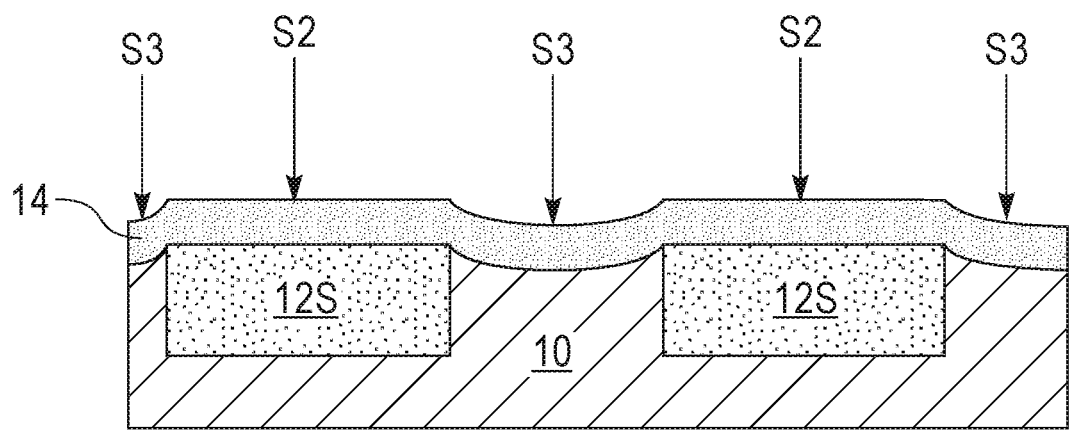
FIG. 3 is a cross sectional view of the exemplary structure of FIG. 2 after forming a first dielectric capping layer having an undulating upper surface on the interconnect dielectric material layer and the at least one electrically conductive structure.

Referring now to FIG. 3, there is illustrated the exemplary structure of FIG. 2 after forming a first dielectric capping layer 14 having an undulating upper surface on the interconnect dielectric material layer 10 and the at least one electrically conductive structure 12S. The undulating upper surface of the first dielectric capping layer 14 has recessed surfaces, S3, and planar surfaces, S2, as shown in FIG. 3. The recessed surfaces, S3, of the first dielectric capping layer 14 are located directly above the recessed surfaces, S1, of the interconnect dielectric material layer 10, and the planar surfaces, S2, of the first dielectric capping layer 14 are located directly above the planar surfaces of the underlying electrically conductive structures 12S. The first dielectric capping layer 14 has a non-planar bottom surface. In the present application, the first dielectric capping layer 14 follows the contour of the exemplary structure shown in FIG. 2.

The first dielectric capping layer 14 is composed of a dielectric material that is typically, but not necessarily always, compositionally different from the dielectric material of the interconnect dielectric material layer 10. Illustrative examples of dielectric materials that can be used as the first dielectric capping layer 14 include, but are not limited to, SiN, SiC, $Si_3N_4$, $SiO_2$, a carbon doped oxide, a nitrogen and hydrogen doped silicon carbide SiC(N,H) or multilayers thereof.

The first dielectric capping layer 14 can be formed utilizing a deposition process such as, for example, CVD, PECVD, chemical solution deposition, evaporation, or ALD. The first dielectric capping layer 14 can have a thickness from 5 nm to 100 nm; although other thicknesses for the first dielectric capping layer 14 are possible and can be used in the present application.

Figure 4:
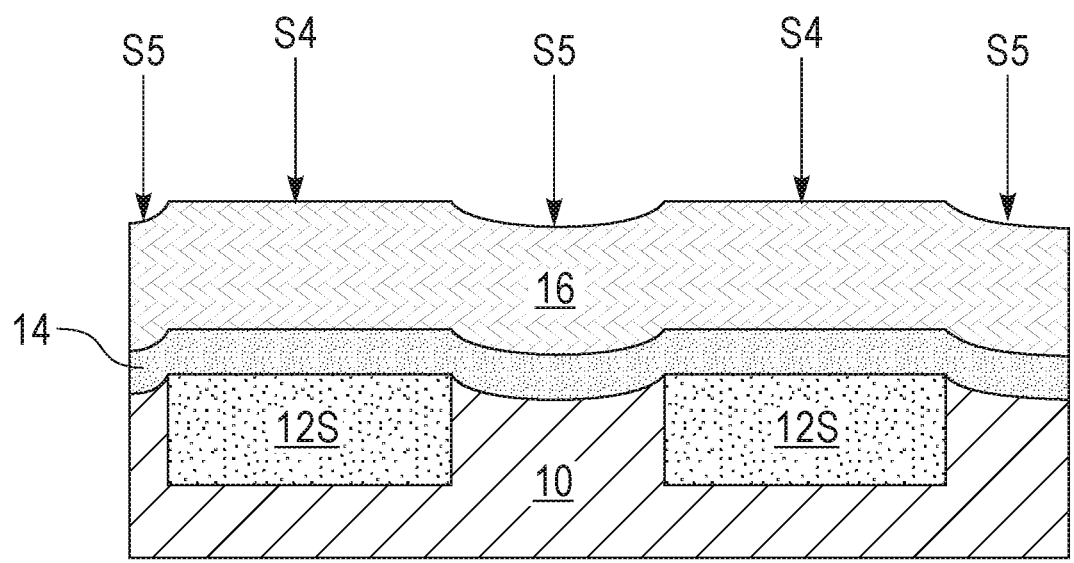
FIG. 4 is a cross sectional view of the exemplary structure of FIG. 3 after forming a second dielectric capping layer having an undulating upper surface on the first dielectric capping layer.

Referring now to FIG. 4, there is illustrated the exemplary structure of FIG. 3 after forming a second dielectric capping layer 16 having an undulating upper surface on the first dielectric capping layer 14 having the undulating surface. The undulating upper surface of the second dielectric capping layer 16 has recessed surfaces, S5, and planar surfaces, S4, as shown in FIG. 4. The recessed surfaces, S5, of the second dielectric capping layer 14 are located directly above the recessed surfaces, S3, of the first dielectric capping layer 14 and the recessed surfaces, S1, of the interconnect dielectric material layer 10, and the planar surfaces, S4, of the second dielectric capping layer 16 are located directly above the planar surfaces, S2, of the first dielectric capping layer 14 and the underlying electrically conductive structures 12S. The second dielectric capping layer 16 has a non-planar bottom surface. In the present application, the second dielectric capping layer 16 follows the contour of the exemplary structure shown in FIG. 3.

The second dielectric capping layer 16 is composed of a dielectric material that is compositionally different from the dielectric material of the first dielectric capping layer 14. Illustrative examples of dielectric materials that can be used as the second dielectric capping layer 16 include, but are not limited to, SiN, SiC, $Si_3N_4$, $SiO_2$, a carbon doped oxide, a nitrogen and hydrogen doped silicon carbide SiC(N,H) or multilayers thereof.

The second dielectric capping layer 16 can be formed utilizing a deposition process such as, for example, CVD, PECVD, chemical solution deposition, evaporation, or ALD. The second dielectric capping layer 16 can have a thickness from 10 nm to 200 nm; although other thicknesses for the second dielectric capping layer 16 are possible and can be used in the present application.

Figure 5:
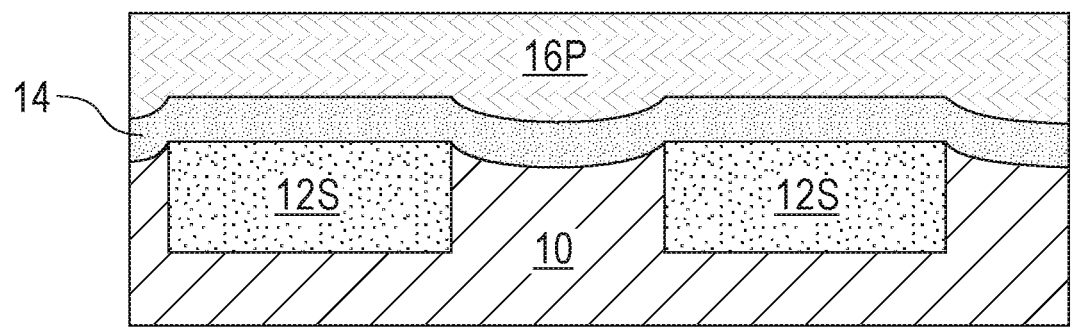
FIG. 5 is a cross sectional view of the exemplary structure of FIG. 4 after planarizing the second dielectric capping layer to provide a planar second dielectric capping layer having an entirely planar topmost surface.

Referring now to FIG. 5, there is illustrated the exemplary structure of FIG. 4 after planarizing the second dielectric capping layer 16 to provide a planar second dielectric capping layer 16P having an entirely planar topmost surface. The planarizing of the second dielectric capping layer 16 includes chemical mechanical polishing (CMP). This step removes the undulating upper surface of the second dielectric capping layer 16 providing a planar second dielectric capping layer 16P which has an entirely planar topmost surface.

Figure 6:
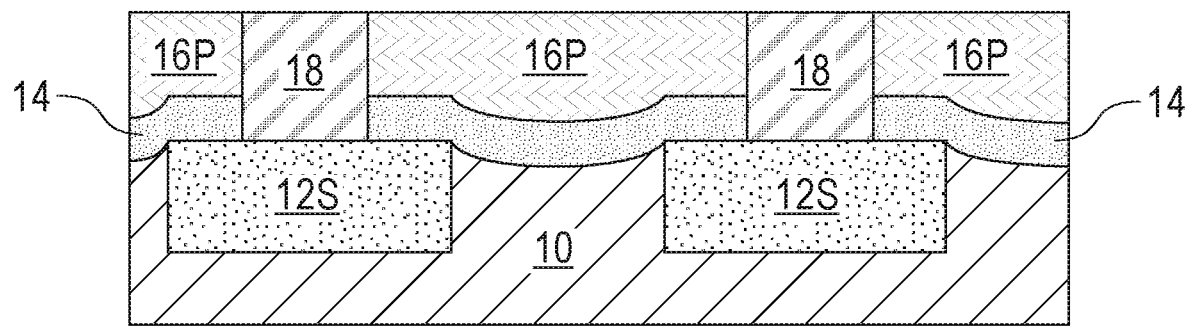
FIG. 6 is a cross sectional view of the exemplary structure of FIG. 5 after forming at least one metal-containing structure that extends through both the planar second dielectric capping layer and the first dielectric capping layer and contacts a surface of the at least one electrically conductive structure.

Referring now to FIG. 6, there is illustrated the exemplary structure of FIG. 5 after forming at least one metal-containing structure 18 that extends through both the planar second dielectric capping layer 16P and the first dielectric capping layer 14 and contacts a surface of the at least one electrically conductive structure 12S.

The at least one metal-containing structure 18 that is employed in the present application is composed of at least one layer of an electrically conductive metal-containing material. In one embodiment, the at least one metal-containing structure 18 is composed of one of the electrically conductive metals or metal alloys as mentioned above for the electrically conductive structure 12S. In another embodiment, the at least one metal-containing structure 18 is composed of a stack including one of the electrically conductive metals or metal alloys as mentioned above for the electrically conductive structure 12S. In yet a further embodiment, the at least one metal-containing structure 18 is composed of a memory stack that can be used as a non-volatile memory device such as, for example, a ferroelectric memory (FE) device, a resistive random access memory (ReRAM) device, a magnetoresistive random access memory (MRAM) device, or a phase change random access memory (PRAM) device.

A FE memory device is a random access memory similar in construction to a DRAM by using a ferroelectric layer instead of a dielectric layer to achieved non-volatility. FE memory devices typically include a material stack of, from bottom to top, a bottom electrode, a ferroelectric layer, and a top electrode. Thus, and in one embodiment of the present application, the at least one metal-containing structure 18 can be an electrically conductive metal-containing material stack of a bottom electrode, a ferroelectric layer, and a top electrode. The bottom and top electrodes may be composed of a metal or metal nitride. For example, TiN may be used as the material for the bottom electrode and/or top electrode. The ferroelectric layer is composed of one or more ferroelectric materials exhibiting ferroelectricity (i.e., a material that has a spontaneous electric polarization that can be reversed by the application of an external electric field). Examples of ferroelectric materials that can be used as the ferroelectric layer include, but at not limited to, mixed metal oxides such as, $BaTiO_3$, $Pb(Zr_xTi_{1-x})O_3$ ($0.1 \leq x \leq 1$), or crystalline $HfO_2$ with, or without, a doping element selected from Zr, Al, Ca, Ce, Dy, Er, Gd, Ge, La, Sc, Si, Sr, Sn, C, N, and Y.

A ReRAM device is a random access memory that typically includes a material stack of, from bottom to top, a bottom electrode, a metal oxide that can exhibit a change in electron localization, and a top electrode. Thus, and in one embodiment of the present application, the at least one metal-containing structure 18 can be an electrically conductive metal-containing material stack of a bottom electrode, a ferroelectric layer, and a top electrode. The bottom and top electrodes may be composed of a metal or metal nitride. For example, TiN may be used as the material for the bottom and/or top electrode. The metal oxide may include oxides of nickel, zirconium, hafnium, iron, or copper.

A MRAM device is a random access memory that includes a magnetic tunnel junction (MTJ) structure. The magnetic tunnel junction (MTJ) structure may include a magnetic reference layer, a tunnel barrier, and a magnetic free layer. Thus, and in one embodiment of the present application, the at least one metal-containing structure 18 is a MTJ structure. The magnetic reference layer has a fixed magnetization. The magnetic reference layer may be composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier of the MTJ structure is composed of an insulator material and is formed at such a thickness as to provide an appropriate tunneling resistance. Exemplary materials for the tunnel barrier include magnesium oxide, aluminum oxide, and titanium oxide, or materials of higher electrical tunnel conductance, such as semiconductors or low-bandgap insulators.

The magnetic free layer of the MTJ structure is composed of at least one magnetic material with a magnetization that can be changed in orientation relative to the magnetization orientation of the reference layer. Exemplary materials for the free layer of the MTJ structure include alloys and/or multilayers of cobalt, iron, alloys of cobalt-iron, nickel, alloys of nickel-iron, and alloys of cobalt-iron-boron.

A PRAM device is a random access memory that typically includes a material stack of, from bottom to top, a bottom electrode, a phase change memory material that exhibits a change in atomic order (from crystalline to amorphous or vice versa), and a top electrode. Thus, and in one embodiment of the present application, the at least one metal-containing structure 18 is an electrically conductive metal-containing material stack of a bottom electrode, a ferroelectric layer, and a top electrode. The bottom electrode and top electrode may be composed of a metal or metal nitride. For example, TiN may be used as the material for the bottom and/or top electrode. The phase change memory material may include a chalcogenide glass such as, for example, $Ge_2Sb_2Te_5$ or $Ge_2Bi_2Te_6$.

In some embodiments, a diffusion barrier liner, as defined above, can be present along the sidewalls and bottom wall of the at least one metal-containing structure 18. In other embodiments, no diffusion barrier liner is present along the sidewalls and bottom wall of the at least one metal-containing structure 18.

The exemplary structure shown in FIG. 6 can be formed by forming at least one opening into the planar second dielectric capping layer 16P and the first dielectric capping layer 14. Each opening that is formed physically exposes a surface of one of the electrically conductive structures 12S present in the interconnect dielectric material layer 10. Each opening can be formed by a patterning process such as, for example, lithography and etching. Following the formation of the at least one opening, a metal-containing layer that includes materials that provide each metal-containing structure 18 is formed into the opening and on the planar topmost surface of the planar second dielectric capping layer 16P. In some embodiments, a diffusion barrier material layer can be formed into the opening and on the planar topmost surface of the planar second dielectric capping layer 16P prior to forming the metal-containing layer. A planarization process such as, for example, CMP and/or grinding can be used to remove the metal-containing layer and, if present, the diffusion barrier material layer that is present outside of the opening and on the planar topmost surface of the planar second dielectric capping layer 16P, while maintaining the metal-containing layer and, if present, the diffusion barrier material layer within the opening. The metal-containing layer that is maintained in the opening defines the metal-containing structure 18, while the diffusion barrier material layer that is maintained in the opening defines a diffusion barrier liner that is located along the sidewalls and bottom wall of the metal-containing structure 18.

In the embodiment illustrated in FIG. 6, each of the metal-containing structures 18 has a topmost surface that is coplanar with each other and coplanar with the planar topmost of the second dielectric capping layer 16P. In the embodiment illustrated in FIG. 6, topography variation is reduced due to the presence of the planar second dielectric capping layer 16P.

Figure 7:
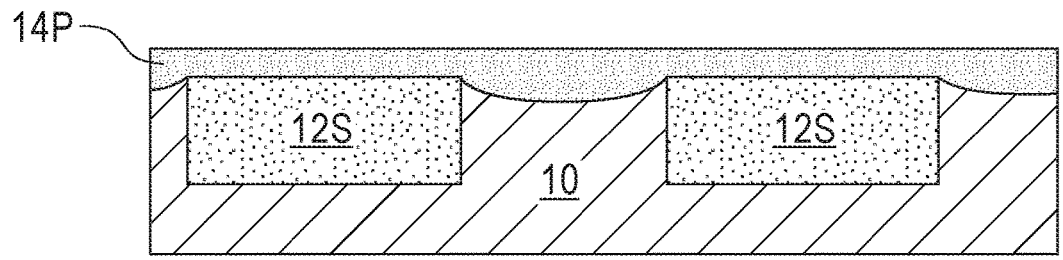
FIG. 7 is a cross sectional view of the exemplary structure of FIG. 3 after planarizing the first dielectric capping layer to provide a planar first dielectric capping layer having an entirely planar topmost surface.

Referring now to FIG. 7, there is illustrated the exemplary structure of FIG. 3 after planarizing the first dielectric capping layer 14 to provide a planar first dielectric capping layer 14P having an entirely planar topmost surface. The planarizing of the first dielectric capping layer 14 includes chemical mechanical polishing (CMP). This step removes the undulating upper surface of the first dielectric capping layer 14 providing a planar first dielectric capping layer 14P which has an entirely planar topmost surface.

Figure 8:
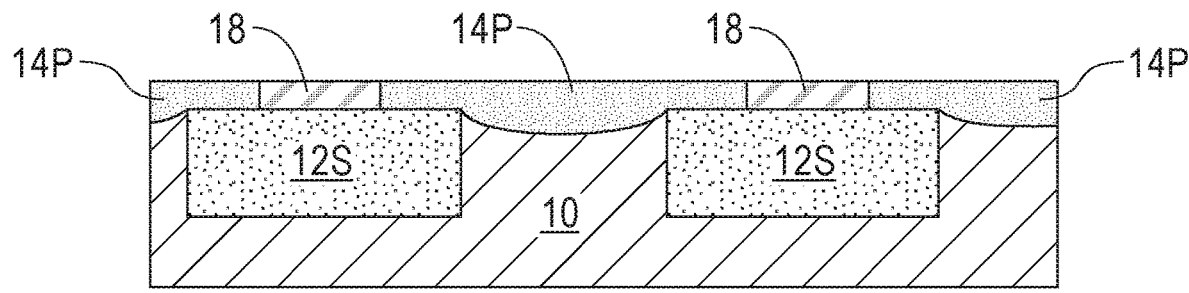
FIG. 8 is a cross sectional view of the exemplary structure of FIG. 7 after forming at least one metal-containing structure that extends through the planar first dielectric capping layer and contacts a surface of the at least one electrically conductive structure.

Referring now to FIG. 8, there is illustrated the exemplary structure of FIG. 7 after forming at least one metal-containing structure 18, as defined above, that extends through the planar first dielectric capping layer 14P and contacts a surface of the at least one electrically conductive structure 12S. The at least one metal-containing structure 18 of this embodiment can include conductive materials as mentioned above for the metal-containing structure 18 shown in FIG. 6. The at least one metal-containing structure 18 of this embodiment can be formed utilizing the processing steps mentioned above for the metal-containing structure 18 shown in FIG. 6. An optional diffusion barrier liner can be formed along the sidewalls and bottom wall of the at least one metal-containing structure 18 of this embodiment of the present application.

In the embodiment illustrated in FIG. 8, each of the metal-containing structures 18 has a topmost surface that is coplanar with each other and coplanar with the planar topmost of the first dielectric capping layer 14P. In the embodiment illustrated in FIG. 8, topography variation is reduced due to the presence of the planar first dielectric capping layer 14P.

Figure 9:
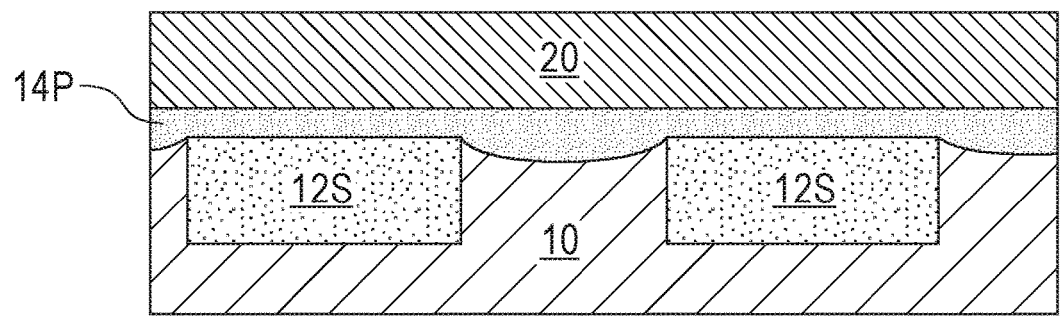
FIG. 9 is a cross sectional view of the exemplary structure of FIG. 7 after forming a planar second dielectric capping layer on the planar first dielectric capping layer.

Referring now to FIG. 9, there is illustrated the exemplary structure of FIG. 7 after forming a planar second dielectric capping layer 20 on the planar first dielectric capping layer 14P. In this embodiment, the planar first dielectric capping layer 14P has an entirely planar topmost surface and an entirely planar bottommost surface.

The planar second dielectric capping layer 20 can include one of the dielectric materials mentioned above for the second dielectric capping layer 16. The planar second dielectric capping layer 20 can be formed by a deposition process, and no subsequently planarization process is needed because of the presence of the planar first dielectric capping layer 14P. The deposition process used in forming the planar second dielectric capping layer 20 includes one of the deposition processes mentioned above in forming the second dielectric capping layer 16.

Figure 10:
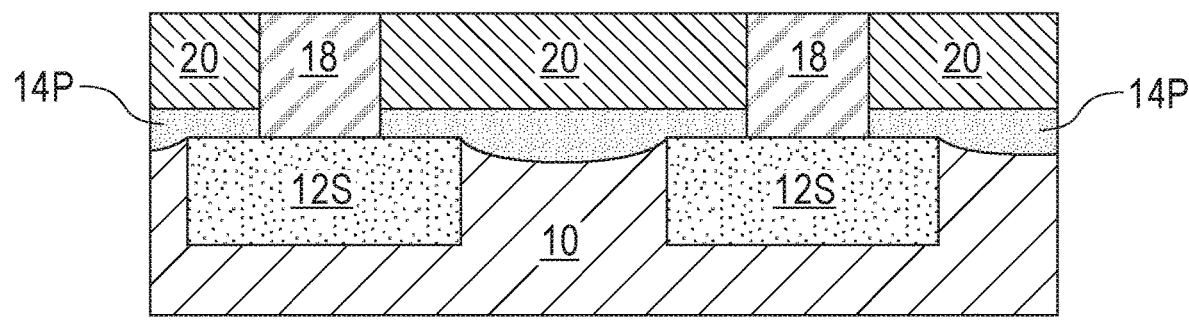
FIG. 10 is a cross sectional view of the exemplary structure of FIG. 9 after forming at least one metal-containing structure that extends through both the planar second dielectric capping layer and the planar first dielectric capping layer and contacts a surface of the at least one electrically conductive structure.

Referring now to FIG. 10, there is illustrated the exemplary structure of FIG. 9 after forming at least one metal-containing structure 18 that extends through both the planar second dielectric capping layer 20 and the planar first dielectric capping layer 14P and contacts a surface of the at least one electrically conductive structure 12S. The at least one metal-containing structure 18 of this embodiment can include conductive materials as mentioned above for the metal-containing structure 18 shown in FIG. 6. The at least one metal-containing structure 18 of this embodiment can be formed utilizing the processing steps mentioned above for the metal-containing structure 18 shown in FIG. 6. An optional diffusion barrier liner can be formed along the sidewalls and bottom wall of the at least one metal-containing structure 18 of this embodiment of the present application.

In the embodiment illustrated in FIG. 10, each of the metal-containing structures 18 has a topmost surface that is coplanar with each other and coplanar with the planar topmost of the planar second dielectric capping layer 20. In the embodiment illustrated in FIG. 10, topography variation is reduced due to the presence of both the planar first dielectric capping layer 14P and the planar second dielectric capping layer 20.

Figure 11:
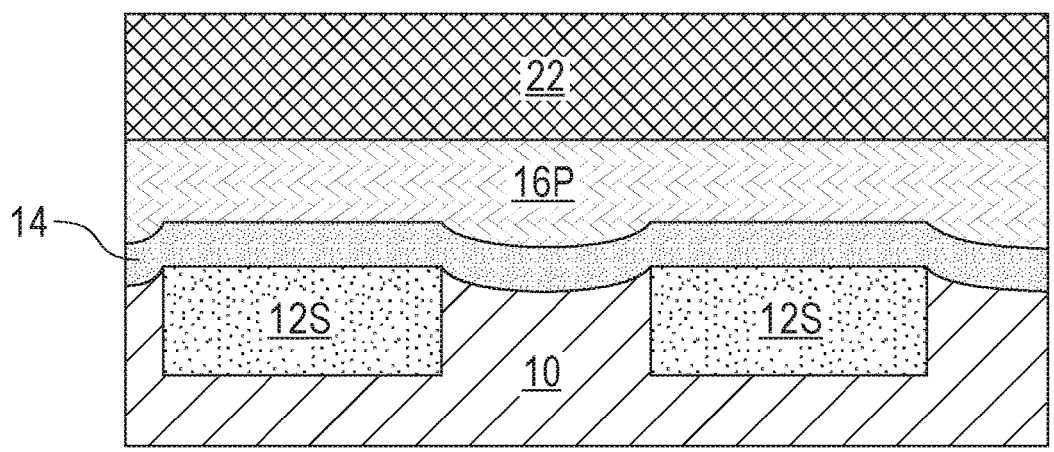
FIG. 11 is a cross sectional view of the exemplary structure of FIG. 5 after forming a second interconnect dielectric material layer on the planar second dielectric capping layer.

Referring now to FIG. 11, there is illustrated the exemplary structure of FIG. 5 after forming a second interconnect dielectric material layer 22 on the planar second dielectric capping layer 16P. In this embodiment, interconnect dielectric material layer 10 can be referred to as a first interconnect dielectric material layer. Due to the presence of the planar second dielectric capping layer 16P, the second interconnect dielectric material layer 22 has an entirely planar topmost surface and an entirely planar bottommost surface.

The second interconnect dielectric material layer 22 includes one of the dielectric materials mentioned above for the interconnect dielectric material layer 10. The dielectric material that provides the second interconnect dielectric material layer 22 can be compositionally the same as, or compositionally different from the dielectric material that provides the planar second dielectric capping layer 16P. The second interconnect dielectric material layer 22 can be formed utilizing one of the deposition processes mentioned above for forming the interconnect dielectric material layer 10. The second interconnect dielectric material layer 22 can have a thickness within the thickness range mentioned above for the interconnect dielectric material layer 10.

Figure 12:
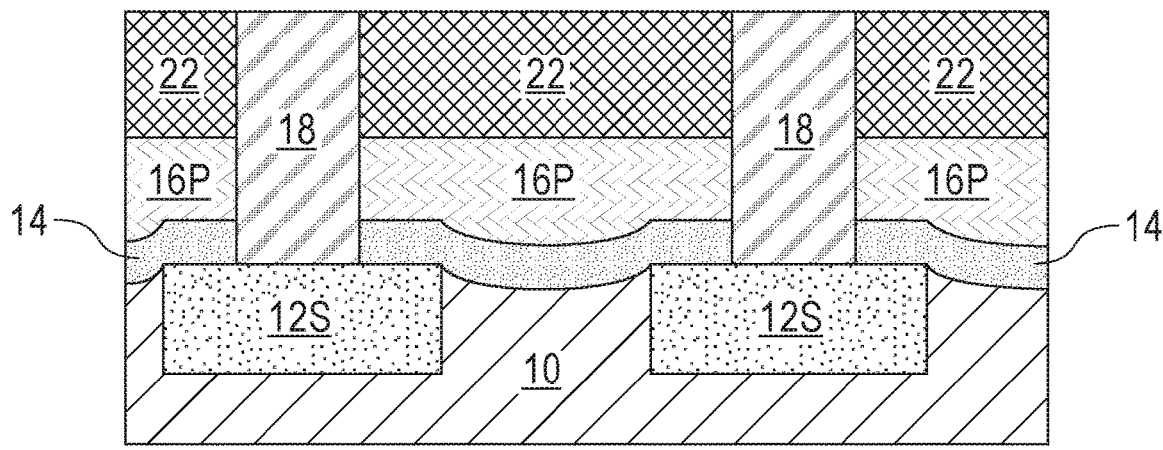
FIG. 12 is a cross sectional view of the exemplary structure of FIG. 11 after forming at least one metal-containing structure that extends through each of the second interconnect dielectric material layer, the planar second dielectric capping layer and the first dielectric capping layer and contacts a surface of the at least one electrically conductive structure.

Referring now to FIG. 12, there is illustrated the exemplary structure of FIG. 11 after forming at least one metal-containing structure 18 that extends through each of the second interconnect dielectric material layer 22, the planar second dielectric capping layer 16P and the first dielectric capping layer 14 and contacts a surface of the at least one electrically conductive structure 12S. The at least one metal-containing structure 18 of this embodiment can include conductive materials as mentioned above for the metal-containing structure 18 shown in FIG. 6. The at least one metal-containing structure 18 of this embodiment can be formed utilizing the processing steps mentioned above for the metal-containing structure 18 shown in FIG. 6. An optional diffusion barrier liner can be formed along the sidewalls and bottom wall of the at least one metal-containing structure 18 of this embodiment of the present application.

In the embodiment illustrated in FIG. 12, each of the metal-containing structures 18 has a topmost surface that is coplanar with each other and coplanar with the planar topmost of the second interconnect dielectric material 22. In the embodiment illustrated in FIG. 12, topography variation is reduced due to the presence of the planar second dielectric capping layer 16P.

Figure 13:
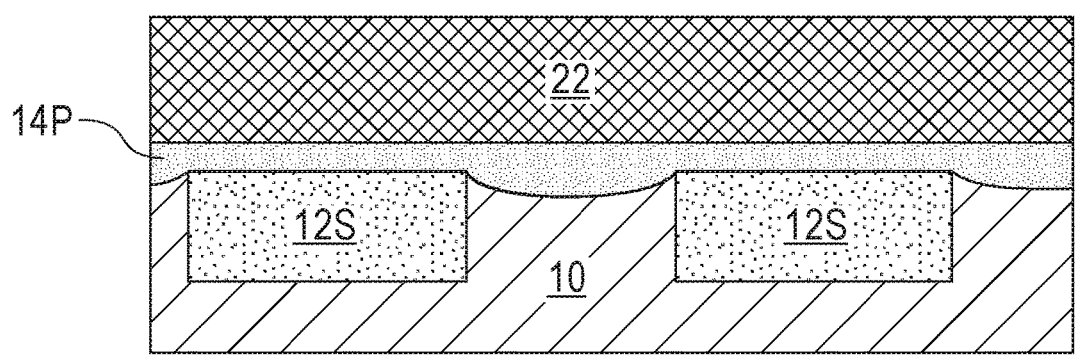
FIG. 13 is a cross sectional view of the exemplary structure of FIG. 7 after forming a second interconnect dielectric material layer on the planar first dielectric capping layer.

Referring now to FIG. 13, there is illustrated the exemplary structure of FIG. 7 after forming a second interconnect dielectric material layer 22 on the planar first dielectric capping layer 14P. In this embodiment, the interconnect dielectric material layer 10 can be referred to as a first interconnect dielectric material layer. Due to the presence of the planar first dielectric capping layer 14P, the second interconnect dielectric material layer 22 has an entirely planar topmost surface and an entirely planar bottommost surface.

The second interconnect dielectric material layer 22 includes one of the dielectric materials mentioned above for the interconnect dielectric material layer 10. The dielectric material that provides the second interconnect dielectric material layer 22 can be compositionally the same as, or compositionally different from the dielectric material that provides the planar first dielectric capping layer 14P. The second interconnect dielectric material layer 22 can be formed utilizing one of the deposition processes mentioned above for forming the interconnect dielectric material layer 10. The second interconnect dielectric material layer 22 can have a thickness within the thickness range mentioned above for the interconnect dielectric material layer 10.

Figure 14:
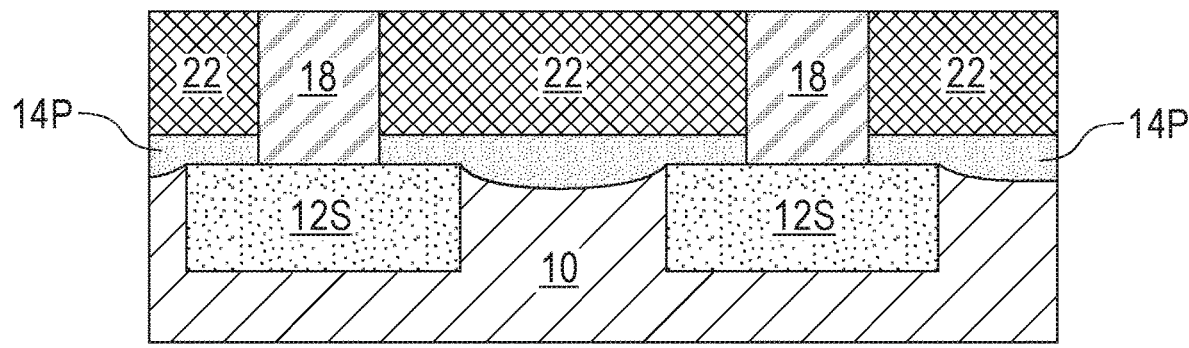
FIG. 14 is a cross sectional view of the exemplary structure of FIG. 13 after forming at least one metal-containing structure that extends through both the second interconnect dielectric material layer and the planar first dielectric capping layer and contacts a surface of the at least one electrically conductive structure.

Referring now to FIG. 14, there is illustrated the exemplary structure of FIG. 13 after forming at least one metal-containing structure 18 that extends through both the second interconnect dielectric material layer 22 and the planar first dielectric capping layer 14P and contacts a surface of the at least one electrically conductive structure 12S. The at least one metal-containing structure 18 of this embodiment can include conductive materials as mentioned above for the metal-containing structure 18 shown in FIG. 6. The at least one metal-containing structure 18 of this embodiment can be formed utilizing the processing steps mentioned above for the metal-containing structure 18 shown in FIG. 6. An optional diffusion barrier liner can be formed along the sidewalls and bottom wall of the at least one metal-containing structure 18 of this embodiment of the present application.

In the embodiment illustrated in FIG. 14, each of the metal-containing structures 18 has a topmost surface that is coplanar with each other and coplanar with the planar topmost of the second interconnect dielectric material 22. In the embodiment illustrated in FIG. 12, topography variation is reduced due to the presence of the planar first dielectric capping layer 14P.

Figure 15:
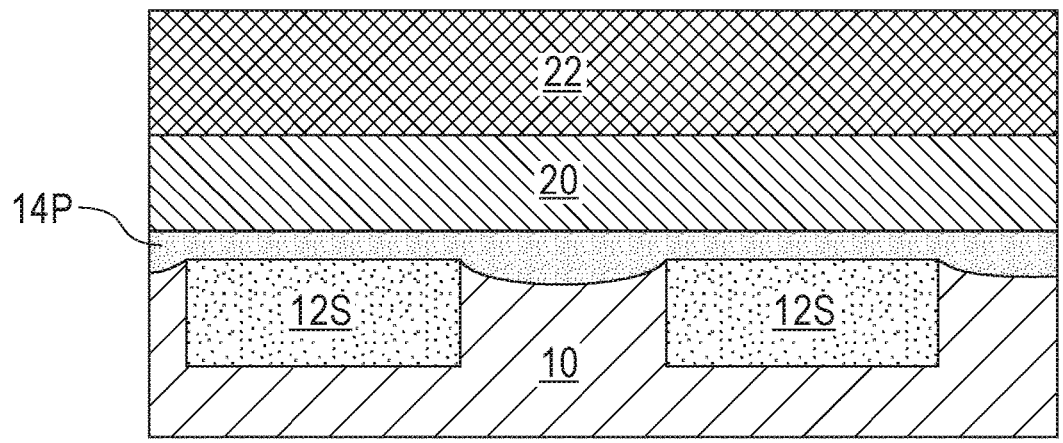
FIG. 15 is a cross sectional view of the exemplary structure of FIG. 9 after forming a second interconnect dielectric material layer on the planar second dielectric capping layer.

Referring now to FIG. 15, there is illustrated the exemplary structure of FIG. 9 after forming a second interconnect dielectric material layer 22 on the planar second dielectric capping layer 20. In this embodiment, interconnect dielectric material layer 10 can be referred to as a first interconnect dielectric material layer. Due to the presence of the planar first dielectric capping layer 14P, and the planar second dielectric capping material layer 20, the second interconnect dielectric material layer 22 has an entirely planar topmost surface and an entirely planar bottommost surface.

The second interconnect dielectric material layer 22 includes one of the dielectric materials mentioned above for the interconnect dielectric material layer 10. The dielectric material that provides the second interconnect dielectric material layer 22 can be compositionally the same as, or compositionally different from the dielectric material that provides the planar second dielectric capping layer 20. The second interconnect dielectric material layer 22 can be formed utilizing one of the deposition processes mentioned above for forming the interconnect dielectric material layer 10. The second interconnect dielectric material layer 22 can have a thickness within the thickness range mentioned above for the interconnect dielectric material layer 10.

Figure 16:
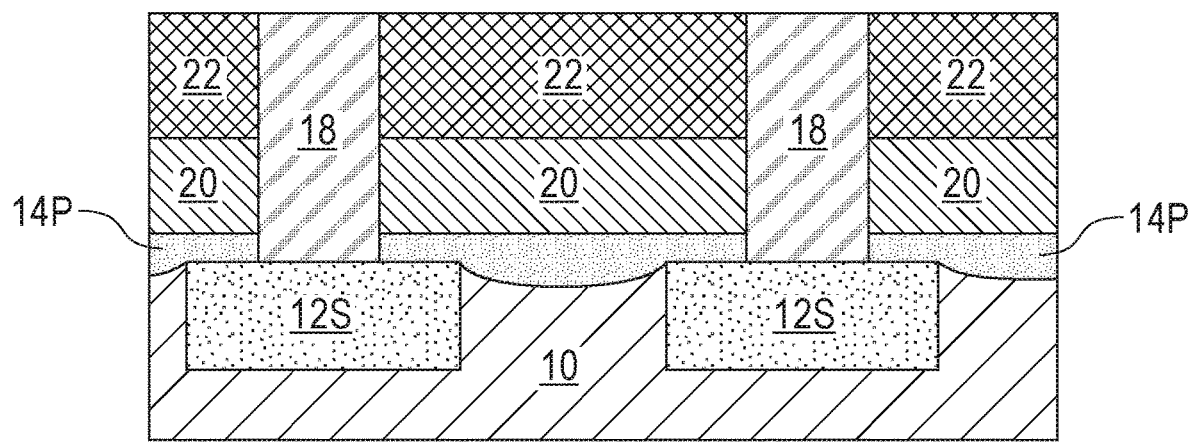
FIG. 16 is a cross sectional view of the exemplary structure of FIG. 15 after forming at least one metal-containing structure that extends through each of the second interconnect dielectric material layer, the planar second dielectric capping layer and the planar first dielectric capping layer and contacts a surface of the at least one electrically conductive structure.

Referring now to FIG. 16, there is illustrated the exemplary structure of FIG. 15 after forming at least one metal-containing structure 18 that extends through each of the second interconnect dielectric material layer 22, the planar second dielectric capping layer 20 and the planar first dielectric capping layer 14P and contacts a surface of the at least one electrically conductive structure 12S. The at least one metal-containing structure 18 of this embodiment can include conductive materials as mentioned above for the metal-containing structure 18 shown in FIG. 6. The at least one metal-containing structure 18 of this embodiment can be formed utilizing the processing steps mentioned above for the metal-containing structure 18 shown in FIG. 6. An optional diffusion barrier liner can be formed along the sidewalls and bottom wall of the at least one metal-containing structure 18 of this embodiment of the present application.

In the embodiment illustrated in FIG. 16, each of the metal-containing structures 18 has a topmost surface that is coplanar with each other and coplanar with the planar topmost of the second interconnect dielectric material 22. In the embodiment illustrated in FIG. 16, topography variation is reduced due to the presence of the planar first dielectric capping layer 14P and the planar second dielectric capping layer 20.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
at least one electrically conductive structure partially embedded in an interconnect dielectric material layer, wherein the interconnect dielectric material layer has a recessed surface located laterally adjacent to the at least one electrically conductive structure;
a first dielectric capping layer located on the interconnect dielectric material layer and the at least one electrically conductive structure, wherein the first dielectric capping layer has a non-planar bottom surface that contacts both the recessed surface of the interconnect dielectric material layer and a planar topmost surface of the at least one electrically conductive structure;
a second dielectric capping layer located on the first dielectric capping layer, wherein the second dielectric capping layer has an entirely planar topmost surface; and
at least one metal-containing structure located in the first dielectric capping layer and the second dielectric capping layer, wherein the at least one metal-containing structure contacts the at least one electrically conductive structure.

2. The structure of claim 1, wherein the first dielectric capping layer has an undulating upper surface comprising recessed surfaces located above each recessed surface of the interconnect dielectric material layer and planar surfaces located above the planar topmost surface of the at least one electrically conductive structure.

3. The structure of claim 2, wherein the second dielectric capping layer has a non-planar bottom surface that contacts the undulating upper surface of the first dielectric capping layer.

4. The structure of claim 3, wherein the entirely planar topmost surface of the second dielectric capping layer is coplanar with a topmost surface of the at least one metal-containing structure.

5. The structure of claim 4, wherein the at least one metal-containing structure is composed of at least one electrically conductive metal-containing material or a stack of electrically conductive metal-containing materials.

6. The structure of claim 4, wherein the at least one metal-containing structure is composed of elements of a ferroelectric memory (FE) stack, a resistive random access memory (ReRAM) stack, a magnetoresistive random access memory (MRAM) stack, or a phase change random access memory (PRAM) stack.

7. The structure of claim 3, further comprising another interconnect dielectric material layer located on the entirely planar topmost surface of the second dielectric capping layer, wherein an upper portion of the at least one metal-containing structure is present in the another interconnect dielectric material layer, and wherein the another interconnect dielectric material layer has a topmost surface that is coplanar with a topmost surface of the at least one metal-containing structure.

8. The structure of claim 7, wherein the at least one metal-containing structure is composed of at least one electrically conductive metal-containing material or a stack of electrically conductive metal-containing materials.

9. The structure of claim 7, wherein the at least one metal-containing structure is composed of elements of a ferroelectric memory (FE) stack, a resistive random access memory (ReRAM) stack, a magnetoresistive random access memory (MRAM) stack, or a phase change random access memory (PRAM) stack.

10. The structure of claim 1, wherein the first dielectric capping layer has an entirely planar topmost surface, and the second dielectric capping layer has an entirely planar bottommost surface that contacts the entirely planar topmost surface of the first dielectric capping layer.

11. The structure of claim 10, wherein the entirely planar topmost surface of the second dielectric capping layer is coplanar with a topmost surface of the at least one metal-containing structure.

12. The structure of claim 11, wherein the at least one metal-containing structure is composed of at least one electrically conductive metal-containing material or a stack of electrically conductive metal-containing materials.

13. The structure of claim 11, wherein the at least one metal-containing structure is composed of elements of a ferroelectric memory (FE) stack, a resistive random access memory (ReRAM) stack, a magnetoresistive random access memory (MRAM) stack, or a phase change random access memory (PRAM) stack.

14. The structure of claim 10, further comprising another interconnect dielectric material layer located on the entirely planar topmost surface of the second dielectric capping layer, wherein an upper portion of the at least one metal-containing structure is present in the another interconnect dielectric material layer, and wherein the another interconnect dielectric material layer has a topmost surface that is coplanar with a topmost surface of the at least one metal-containing structure.

15. The structure of claim 14, wherein the at least one metal-containing structure is composed of at least one electrically conductive metal-containing material or a stack of electrically conductive metal-containing materials.

16. The structure of claim 14, wherein the at least one metal-containing structure is composed of elements of a ferroelectric memory (FE) stack, a resistive random access memory (ReRAM) stack, a magnetoresistive random access memory (MRAM) stack, or a phase change random access memory (PRAM) stack.

17. A structure comprising:
   at least one electrically conductive structure partially embedded in an interconnect dielectric material layer, wherein the interconnect dielectric material layer has a recessed surface located laterally adjacent to the at least one electrically conductive structure;
   a first dielectric capping layer located on the recessed surface of the interconnect dielectric material layer and the at least one electrically conductive structure, wherein the first dielectric capping layer has an entirely planar topmost surface and a non-planar bottom surface that contacts both the recessed surface of the interconnect dielectric material layer and a planar topmost surface of the at least one electrically conductive structure; and
   at least one metal-containing structure located in the first dielectric capping layer, wherein the at least one metal-containing structure contacts the at least one electrically conductive structure.

18. The structure of claim 17, wherein the at least one metal-containing structure has a topmost surface that is coplanar with the entirely planar topmost surface of the first dielectric capping layer.

19. The structure of claim 17, further comprising another interconnect dielectric material layer located on the entirely planar topmost surface of the first dielectric capping layer, wherein an upper portion of the at least one metal-containing structure is present in the another interconnect dielectric material layer, and wherein the another interconnect dielectric material layer has a topmost surface that is coplanar with a topmost surface of the at least one metal-containing structure.

20. The structure of claim 17, wherein the at least one metal-containing structure is composed of at least one electrically conductive metal-containing material, a stack of electrically conductive metal-containing materials, elements of a ferroelectric memory (FE) stack, elements of a resistive random access memory (ReRAM) stack, elements of a magnetoresistive random access memory (MRAM) stack, or elements of a phase change random access memory (PRAM) stack.

* * * * *